United States Patent
Yoshitaka et al.

(10) Patent No.: US 6,620,739 B1
(45) Date of Patent: Sep. 16, 2003

(54) METHOD OF MANUFACTURING SEMICONDUCTOR DEVICE

(75) Inventors: Hikaru Yoshitaka, Fuchu (JP); Yoshihiro Kato, Zama (JP); Takashi Kobayashi, Kofu (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/657,620

(22) Filed: Sep. 8, 2000

Related U.S. Application Data

(63) Continuation of application No. PCT/JP00/01320, filed on Mar. 6, 2000.

(30) Foreign Application Priority Data

Mar. 9, 1999 (JP) .............................. 11-62378

(51) Int. Cl.[7] ...................... H01L 21/31; H01L 21/4763
(52) U.S. Cl. ...................... 438/761; 438/624; 438/738; 438/763; 438/778
(58) Field of Search ................... 438/761, 763, 438/778, 789, 931, 624, 738

(56) References Cited

U.S. PATENT DOCUMENTS

| | | | | |
|---|---|---|---|---|
| 4,818,560 A | * | 4/1989 | Ishihara et al. ............. | 427/562 |
| 4,824,697 A | * | 4/1989 | Ishihara et al. ........ | 427/249.15 |
| 5,011,706 A | * | 4/1991 | Tarhay et al. ............... | 427/573 |
| 5,244,730 A | * | 9/1993 | Nguyen et al. ............. | 428/336 |
| 5,466,639 A | * | 11/1995 | Ireland ....................... | 438/633 |
| 5,645,947 A | * | 7/1997 | Hirooka et al. ............. | 428/688 |
| 5,674,599 A | * | 10/1997 | Yamada ....................... | 428/212 |
| 5,698,901 A | * | 12/1997 | Endo ........................... | 257/758 |
| 5,850,102 A | * | 12/1998 | Matsuno ....................... | 257/635 |
| 5,910,342 A | * | 6/1999 | Hirooka et al. ............. | 427/573 |
| 6,150,258 A | * | 11/2000 | Mountsier et al. .......... | 438/623 |
| 6,218,299 B1 | * | 4/2001 | Akahori et al. ............. | 438/682 |
| 2001/0001741 A1 | * | 5/2001 | Akahori et al. ............. | 438/706 |

FOREIGN PATENT DOCUMENTS

| | | |
|---|---|---|
| JP | 9-275138 | 10/1997 |
| JP | 10-144676 | 5/1998 |
| JP | 10-144677 | 5/1998 |
| JP | 2000-77406 | 3/2000 |

\* cited by examiner

Primary Examiner—Matthew Smith
Assistant Examiner—Lex H. Malsawma
(74) Attorney, Agent, or Firm—Finnegan, Henderson, Farabow, Garrett & Dunner LLP

(57) ABSTRACT

An inorganic insulating film 103 of SiC is formed on a fluorine-containing carbon film 102 by a chemical vapor deposition process using $SiF_4$ and $C_2H_4$ as source gases. By using $SiF_4$ and $CF_4$ containing no hydrogen (H) as source gases, H inhibited from being incorporated into the inorganic insulating film 103 forming a hard mask 113. Thus, H having diffused outwardly from the inorganic insulating film 103 is bonded to fluorine (F) in the fluorine-containing carbon film 102 to form HF which inhibits the corrosion of the inorganic insulating film 103 and so forth. Thus, it is possible to inhibit the deterioration of the adhesion of the hard mask 113 formed of the inorganic insulating film 103 to other layers, such as the fluorine-containing carbon film 102.

9 Claims, 6 Drawing Sheets

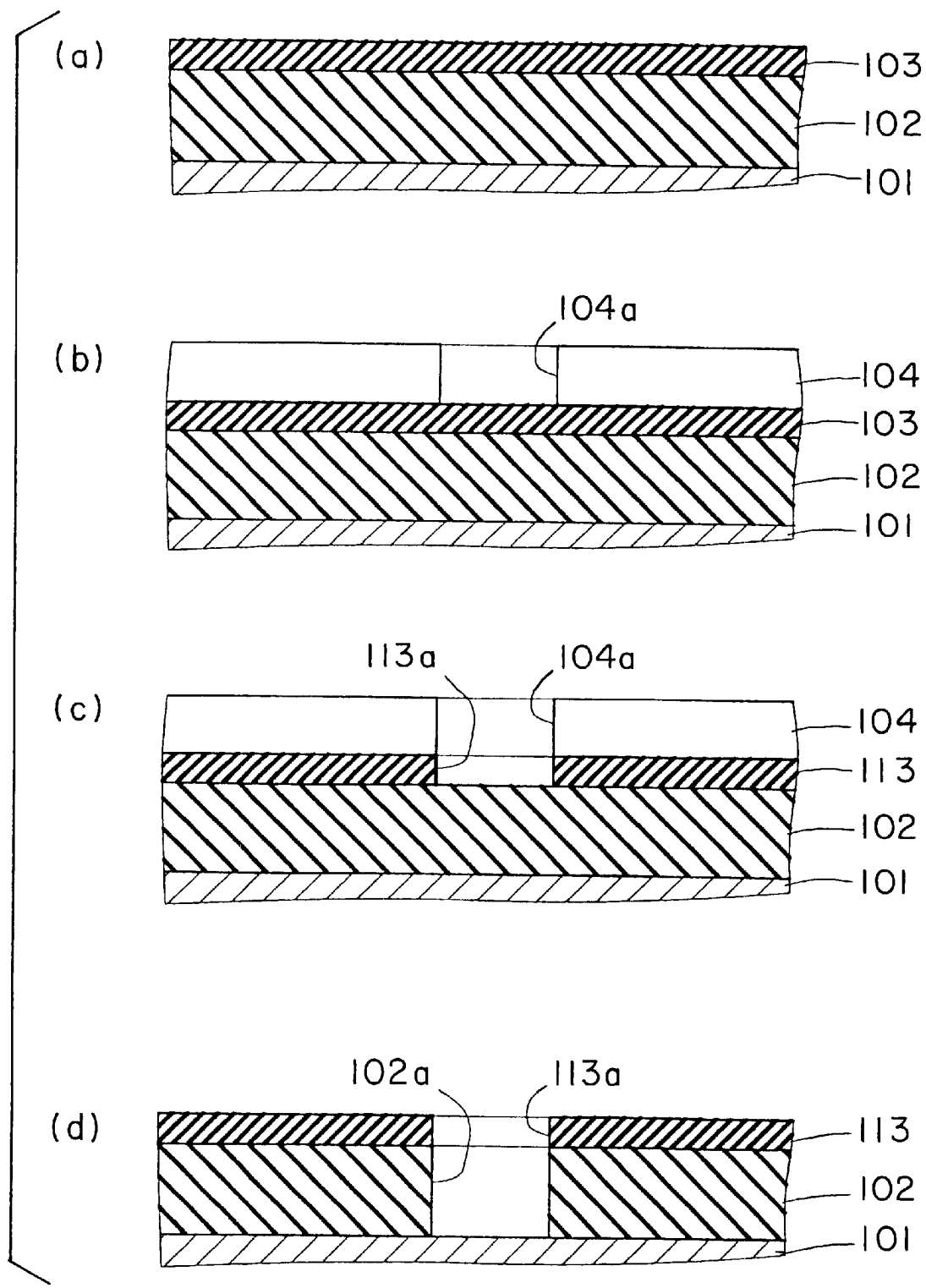
F I G. 1

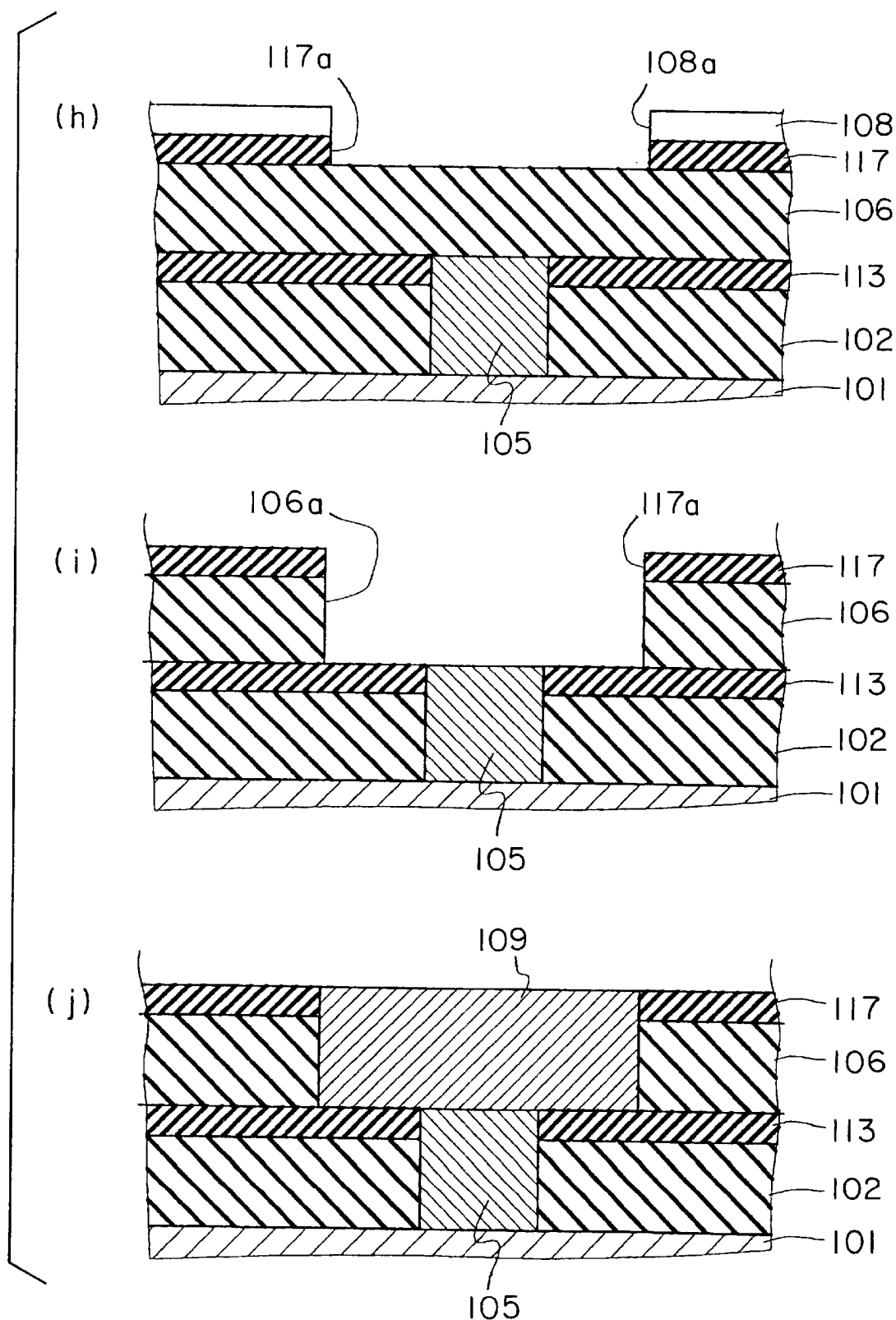
F I G. 1

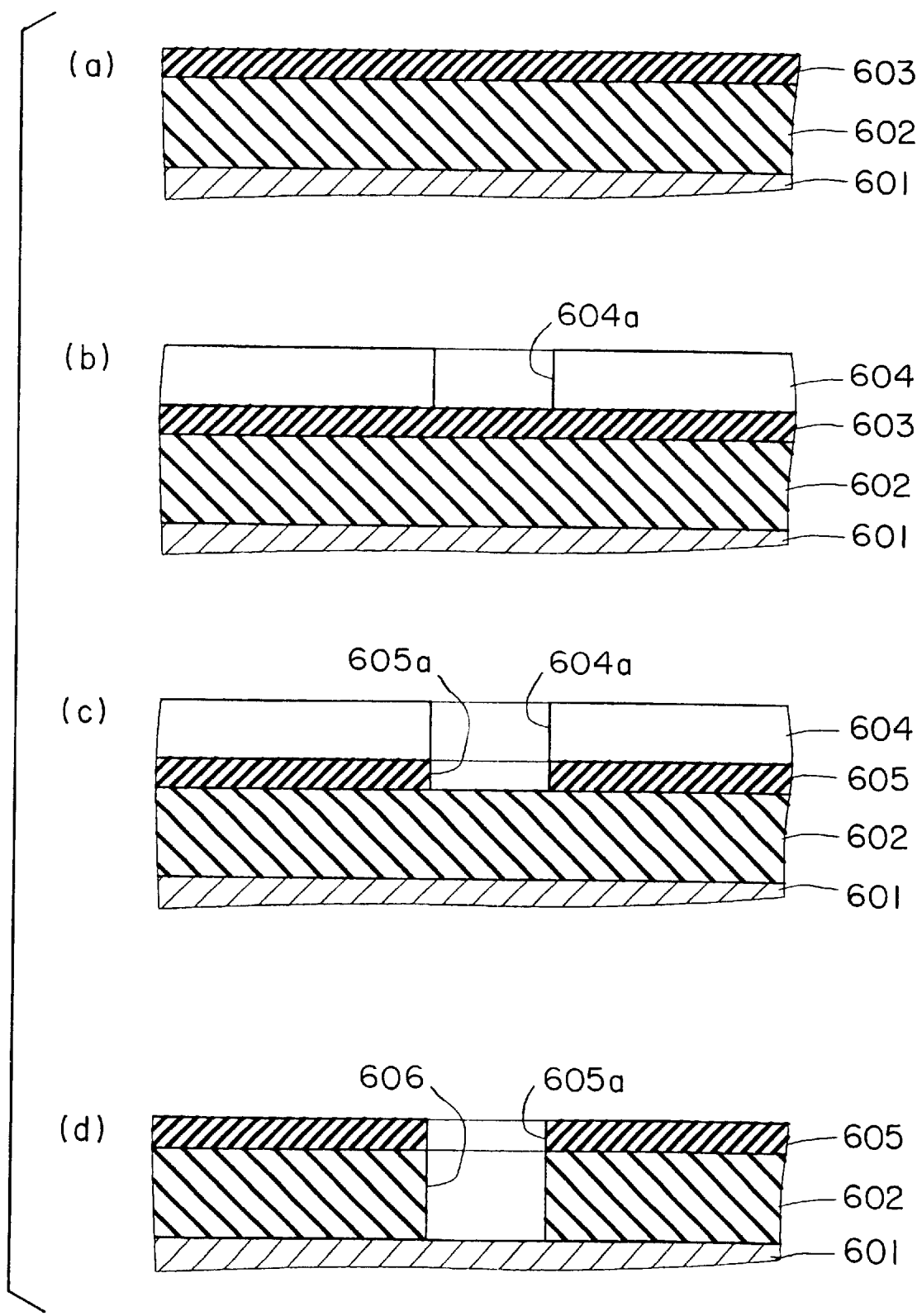
F I G. 4

METHOD OF MANUFACTURING SEMICONDUCTOR DEVICE

CROSS REFERENCE TO RELATED APPLICATION

This application is a continuation of International Application No. PCT/JP00/01320, filed Mar. 6, 2000.

TECHNICAL FIELD

The present invention relates generally to a method of manufacturing a semiconductor device using a fluorine-containing layer, such as a fluorine-containing carbon layer, as an insulating layer.

BACKGROUND ART

In the recent semiconductor integrated circuit producing industry, technical developments, such as the scale down of wiring patterns and the multilayering of wiring, have been made in order to achieve the high density integration. For example, in the wiring multilayering technique, there is used a wiring structure wherein a plurality of wiring layers are stacked via interlayer dielectric films and wherein adjacent two of the wiring layers are connected to each other by a conductive portion arranged in a through hole formed in each of the interlayer dielectric films.

In this case, a silicon oxide ($SiO_2$) film capable of being easily formed on a silicon substrate, which comes into widest use as a semiconductor substrate, is generally used as the interlayer dielectric film. However, $SiO_2$ has a relatively large relative dielectric constant $\in$ of about 4, which is an obstacle to develop more rapid semiconductor integrated circuits.

In order to solve such a problem, there is proposed a fluorine-containing carbon film which has a smaller relative dielectric constant than that of $SiO_2$ and which comprises carbon (C) and fluorine (F). The fluorine-containing carbon film can be formed by a plasma process using the electron cyclotron resonance (ECR).

This film-forming method will be described. First, a film-forming system shown in FIG. 3 is used. This film-forming system comprises a plasma producing chamber 501a of manufacturing plasma, and a film-forming chamber 501b communicated therewith. A microwave of 2.45 GHz is supplied to the plasma producing chamber 501a from a high-frequency power supply unit 502 via a waveguide 502a to produce plasma. In the film-forming chamber 501b, a supporting table 506 is arranged, and a wafer 507 to be processed is fixed thereon by an electrostatic chuck 506a. The interior of each of the plasma producing chamber 501a and film-forming chamber 501b is evacuated to a predetermined degree of vacuum by an evacuating means (not shown) which is communicated thereto via an exhaust pipe 510.

Such a film-forming system is used for forming a fluorine-containing carbon film on the wafer 507 as follows. First, the microwave of 2.45 GHz is supplied to the plasma producing chamber 501a from the high-frequency power supply unit 502 via the waveguide 502a. Then, together therewith, a magnetic field of 875 gausses is applied by magnetic coils 503 and 503a to activate argon (Ar) gas, which has been introduced from an introducing pipe 504, by the electron cyclotron resonance to be high-density plasma. On the other hand, $C_4F_8$ and $C_2H_4$ gases are introduced into the film-forming chamber 501b from a gas supply part 505 via gas introducing pipes 505a and 505b to activate these gases by the high density plasma to form active species (radicals and so forth). Then, by the active species, a fluorine-containing carbon film 508 having good adhesion and high hardness is formed on the wafer 507 which is fixed on the supporting table 506 arranged in the film-forming chamber 501b.

By the way, as described above, in order to construct a semiconductor device, upper and lower wiring layers are connected to each other by the conductive portion, which is arranged in a through hole formed in an interlayer dielectric film, so that it is required to carry out a fine pattern process, such as the formation of a through hole in an interlayer dielectric film. Thus, it is necessary to carry out a fine pattern process, such as the formation of a through hole in the fluorine-containing carbon film used as an interlayer dielectric film.

However, the fluorine-containing carbon film is an organic material, so that the patterning technique for an $SiO_2$ film which is an inorganic film can not be used as it is. The reason for this is as follows. First, in the fine pattern process, a resist pattern having formed generally by the photolithography technique is used as a mask to carry out a selective etching. At this time, the resist pattern must have an etching resistance as a mask against an underlying layer to be patterned. If the layer to be patterned is thick, the etching resistance of the resist pattern is particularly required. This resist pattern is formed by, e.g., exposing and developing a photoresist having photosensitivity, and is made of an organic material.

However, when an organic film, such as the above described fluorine-containing carbon film, is fine-patterned, a dry etching using the plasma of oxygen gas ($O_2$) is used. In this case, if the resist pattern being the organic film is used as a mask, the resist pattern is also etched, so that it is not possible to carry out any selective etching processes. Thus, if the photoresist is used as a master pattern as conventional methods, it is not possible to carry out any selective etching processes, and the master pattern is also etched. Therefore, the dimension of the master pattern and so forth vary, so that it is not possible to precisely fine-pattern the fluorine-containing carbon film.

On the other hand, if a master pattern of an inorganic insulating material, such as $SiO_2$, is used when the fluorine-containing carbon film is etched with the plasma of $O_2$, the master pattern is hardly etched with the plasma of $O_2$. Therefore, it is possible to carry out a selective etching, so that it is possible to carry out a fine pattern process while maintaining a high dimensional precision.

For that reason, in the fine pattern process of the fluorine-containing carbon film, a hard mask of $SiO_2$ or the like is used. If the hard mask is made of an inorganic insulating material, it is possible to obtain a high etch selectivity to the fluorine-containing carbon film, so that the hard mask may be thin.

Therefore, if the fluorine-containing carbon film is used as the interlayer dielectric film, there is no problem from the point of view of insulation performance even if the hard mask remains, and there is no serious problem with respect to the relative dielectric constant if the thickness is small. For that reason, if the fluorine-containing carbon film is used as the interlayer dielectric film, the hard mask having used for the pattern lithography is designed to remain without being removed, since the number of steps increases if the hard mask is removed.

The fine pattern process of the fluorine-containing carbon film using such a hard mask will be described below.

First, as shown in FIG. 4(a), a fluorine-containing carbon film 602 is formed on a bottom wiring layer 601 serving as a substrate as described above. Then, an inorganic insulating film 603 of $SiO_2$ is formed on the fluorine-containing carbon film 602 by a chemical vapor deposition (CVD) method using $SiH_4$ or the like as a raw material, which is a well-known technique. The silicon (Si) containing inorganic insulating layer, such as $SiO_2$, is a generally used insulating material since it has good adhesion to metallic materials used as materials of wiring layers and since its raw material is inexpensive and its deposition technique is established so that it can be easily handled.

Then, as shown in FIG. 4(b), a resist pattern 604 having an opening portion 604a at a predetermined position is formed on the inorganic insulating film 603 by a well-known photolithography technique.

Then, the resist pattern 604 is used as a mask for selectively etching the inorganic insulating film 603. Thus, as shown in FIG. 4(c), a hard mask 605 having an opening portion 605a at a position corresponding to the opening portion 604a is formed. In this etching, a dry etching using, e.g., the plasma of $CF_4$ or $C_3F_8$, may be used.

Then, the hard mask 605 is used as a mask for selectively etching the fluorine-containing carbon film 602. Thus, as shown in FIG. 4(d), a hole portion 606 is formed in the fluorine-containing carbon film 602. In this etching, a dry etching using, e.g., the plasma of $O_2$, may be used. As described above, if $O_2$ is used, it is possible to obtain a high etch selectivity (a ratio of etch rates) between the fluorine-containing carbon film 602 and the hard mask 605. If the plasma of $O_2$ is used, the resist pattern 602 can be simultaneously etched and removed.

However, if the hard mask of $SiO_2$ or silicon nitride (SiN), which is generally used for patterning organic films, is caused to remain after being used for the fine pattern lithography of the fluorine-containing carbon film, there is a problem in that the adhesion of the hard mask to the upper and lower layers deteriorates with age so as to lower the reliability of the semiconductor device using the fluorine-containing carbon film as the insulating layer. For example, even if the adhesion is maintained during the pattern lithography using the hard mask, peeling occurs in the hard mask portion after the semiconductor device is completed, so that a failure is caused in the semiconductor device.

DISCLOSURE OF THE INVENTION

The present invention has been made in order to eliminate the above described problems. That is, it is an object of the present invention to provide a method of manufacturing a semiconductor device, which can improve the reliability of the semiconductor device having a structure wherein a fluorine-containing insulating layer, such as a fluorine-containing carbon film, is adjacent to a silicon containing insulating layer serving as a hard mask.

In order to accomplish this object, according to one aspect of the present invention, there is provided a method of manufacturing a semiconductor device comprising the steps of: forming a wiring layer on a semiconductor substrate, on which an element has been formed; forming a first insulating layer containing fluorine on the wiring layer; forming a second insulating layer containing silicon on the first insulating layer; selectively etching the second insulating layer until a part of a surface of the first insulating layer is exposed; selectively etching the first insulating layer using the selectively etched second insulating layer as a mask; and forming a new wiring layer on the second insulating layer after selectively etching the first insulating layer, wherein a silicon compound containing no hydrogen is used as a raw material of silicon constituting the second insulating layer at the step of forming the second insulating layer.

If the silicon compound containing no hydrogen is thus used as the raw material of silicon constituting the second insulating layer at the step of forming the second insulating layer, hydrogen is inhibited from being incorporated into the formed second insulating layer, so that hydrogen is also inhibited from being degassed from the formed second insulating layer. Therefore, hydrogen having diffused outwardly from the second insulating layer to the first insulating layer is inhibited from being bonded to fluorine in the first insulating layer to form HF. As a result, the corrosion of the second insulating layer with HF is inhibited, so that the deterioration of the adhesion of the second insulating layer to other layers is inhibited. Therefore, according to the present invention, it is possible to improve the reliability of a semiconductor device having a structure wherein a fluorine-containing insulating layer is adjacent to a silicon containing insulating layer.

If a substance containing no hydrogen is used as a raw material of a substance other than silicon constituting the second insulating layer at the step of the second insulating layer, hydrogen is further inhibited from being incorporated into the second insulating layer.

The step of forming the second insulating layer may be carried out by a chemical vapor deposition process or a sputtering process. In the latter sputtering process, if the plasma of a gas containing no hydrogen is used, hydrogen is further inhibited from being incorporated into the second insulating layer.

BRIEF DESCRIPTION OF THE DRAWINGS

FIG. 4 shows schematic longitudinal sections showing steps (a) through (d) of a conventional method of manufacturing a semiconductor device.

BEST MODE FOR CARRYING OUT THE INVENTION

Figure 1:
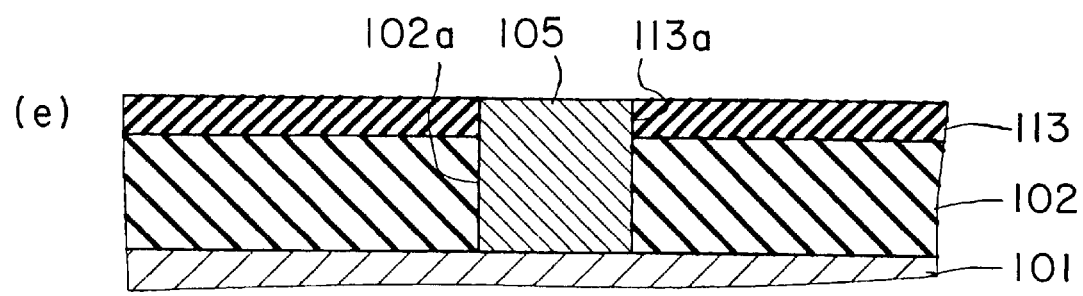
FIG. 1 shows schematic longitudinal sections showing steps (a) through (j) of a preferred embodiment of a method of manufacturing a semiconductor device according to the present invention.
Figure 1:
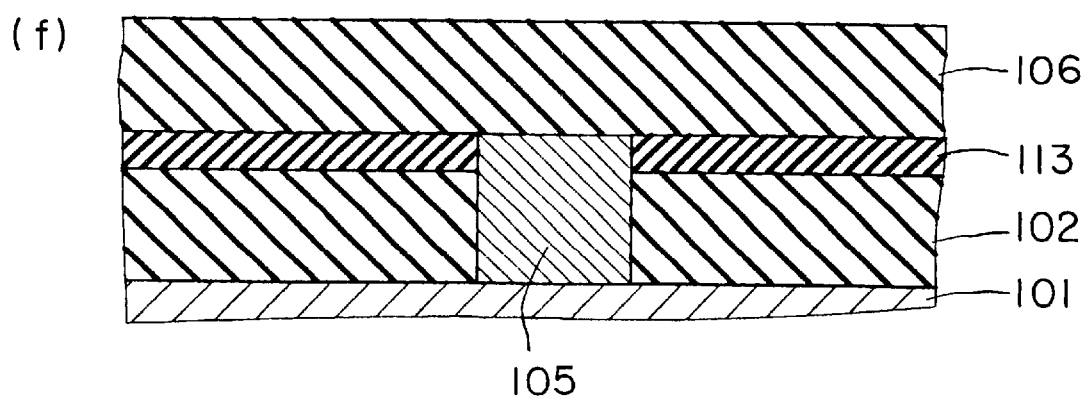
Figure 1:
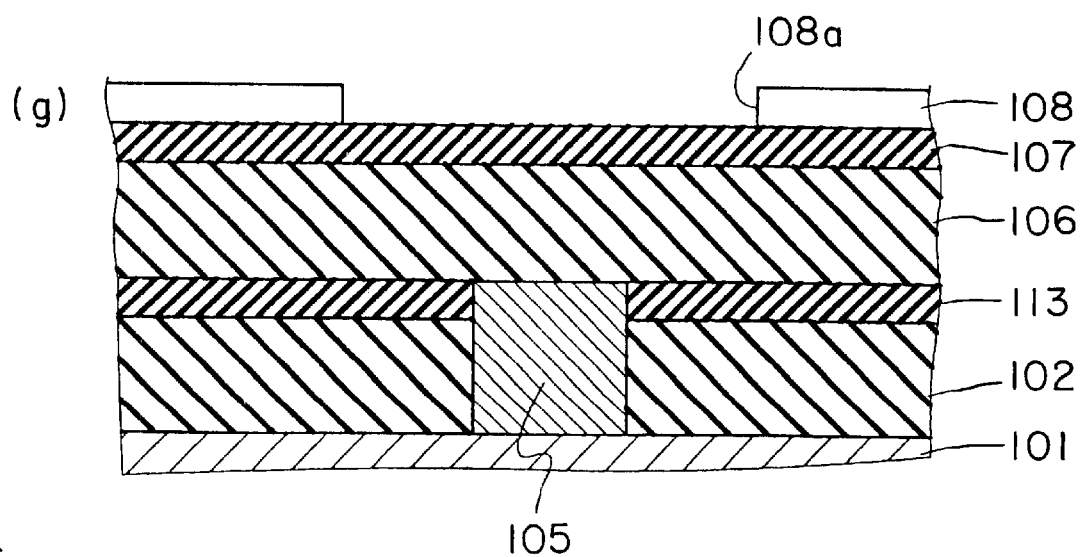

Referring to FIG. 1, steps (a) through (j) of a preferred embodiment of a method of manufacturing a semiconductor device according to the present invention will be described below.

First, as shown in FIG. 1(a), a fluorine-containing carbon film (a first insulating layer) 102 having a thickness of about 400 nm is formed on a bottom wiring layer 101 formed on a semiconductor substrate (not shown), on which elements or the like have been formed. This is carried out by a plasma deposition process using the electron cyclotron resonance using, e.g., $C_4F_8$ and $C_2H_4$ gases as source gases.

Then, an inorganic insulating film (a second insulating layer) 103 of SiC is formed on the fluorine-containing carbon film 102 by the CVD method using, e.g., $SiF_4$ and $C_2H_4$ as source gases. This can be formed by, e.g., the plasma CVD method, by supplying $SiF_4$, $C_2H_4$ and Ar gases at flow rates of 10 sccm, 15 sccm and 200 sccm, respectively, while supplying a microwave having an output of 2500 W to form produce plasma, and by setting a substrate temperature of 360° C. This inorganic insulating film 103 is used as a hard mask as will be described later.

Then, as shown in FIG. 1(b), a resist pattern 104 having an opening portion 104a at a predetermined position is formed on the inorganic insulating film 103. In the formation of this resist pattern 104, a well-known photolithography technique can be used.

Then, the resist pattern 104 is used as a mask for etching the inorganic insulating film 103 to form a hard mask 113 having an opening portion 113a as shown in FIG. 1(c). In this etching, a dry etching with, e.g., the plasma of $C_4F_8$, may be used. In this dry etching with the plasma of $C_4C_8$, the fluorine-containing carbon film 102 is hardly etched, so that the hard mask 113 can be patterned by the selective etching.

Then, the hard mask 113 having the opening portion 113a is used as a mask for selectively etching the underlying fluorine-containing carbon film 102. Thus, as shown in FIG. 1(d), a hole portion 102a is formed in the fluorine-containing carbon film 102. In this etching, a reactive ion etching with the plasma of $O_2$ is used, so that the resist pattern being an organic film can be simultaneously removed. On the other hand, the hard mask 113 is hardly etched with the plasma of $O_2$ to remain since it is formed of SiC.

Then, as shown in FIG. 1(e), a conductive material, such as aluminum (Al), is filled in the formed hole portion 102a and opening portion 113a to form a plug 105.

Then, as shown in FIG. 1(f), a fluorine-containing carbon film 106 having a thickness of about 400 nm is formed on the hard mask 113 including the top face of the plug 105.

Then, as shown in FIG. 1(g), an inorganic insulating film 107 of SiC is formed on the fluorine-containing carbon film 106 by the CVD method using $SiF_4$ and $CF_4$ as source gases. Subsequently, a resist pattern 108 having a groove portion 108a at a predetermined position is formed. This groove portion 108a is formed so as to pass over the plug 105 which has been formed.

Then, the resist pattern 108 is used as a mask for etching the inorganic insulating film 107 to form a hard mask 117 having a groove portion 117a as shown in FIG. 1(h). In this etching, a dry etching with, e.g., the plasma of $C_4F_8$, may be used.

Then, as shown in FIG. 1(i), the hard mask 117 having the groove portion 117a is used as a mask for selectively etching the underlying fluorine-containing carbon film 106 to form a groove portion 116a. This is carried out simultaneously with the above described formation of the hole portion 102a, and the resist pattern 108 is also simultaneously removed.

Then, as shown in FIG. 1(j), a conductive material, such as Al, is filled in the groove portion 106a and groove portion 117a to form a wiring 109 which is connected to the plug 105 having been formed. As a result, there is formed a semiconductor device having a structure wherein the wiring 109 is connected to the bottom wiring layer 101 via the plug 105. Of course, a semiconductor device having three or more wiring layers can be formed by repeating the above described process.

As described above, in this preferred embodiment, the inorganic insulating film (the second insulating layer) used as the hard mask is formed by the CVD method using $SiF_4$ and $CF_4$ containing no H as source gases, so as to inhibit H from being incorporated into the hard mask. Thus, as will be described later, it is possible to inhibit the deterioration of adhesion of the hard mask to other layers, such as the fluorine-containing carbon film.

First, if H exists in the hard mask to be diffused outwardly from the hard mask, H is combined with F in the adjacent fluorine-containing carbon film to produce HF. The produced HF corrodes the hard mask and adjacent wiring layer, so that the adhesion between the fluorine-containing carbon film or wiring layer and the hard mask deteriorates.

For example, as conventional methods, if $SiH_4$ containing H is used as a raw material of Si, which forms an inorganic insulating film of SiC, for depositing the inorganic insulating film by the CVD method using $CF_4$ as another source gas, H is incorporated into the inorganic insulating film.

This is the same even in the formation of an inorganic insulating film of $SiO_2$ using tetraethoxysilane (TEOS: $Si(OC_2H_5)_4$) as a raw material. In particular, if a compound of Si and H is used as a raw material of Si, H is easily incorporated into the formed inorganic insulating film. The reason for this is that the Si—H state is easy to participate in the deposition even in the stage that the raw material gas is decomposed to deposit Si since the bond energy of Si and H is high.

On the other hand, even if a hydrocarbon compound, such as $C_2H_4$, is used as a raw material of C forming an inorganic insulating film of SiC, H is hardly incorporated into the formed inorganic insulating film. The reason for this is that the C—H state hardly participates in the deposition in the stage that C is deposited since the bond energy of C—H is not so high and since the C—H is easily dissociated in a deposition environment of the plasma CVD and thermal CVD. Also, because H is removed more easily than C in a high energy state during the deposition by the CVD method even if the C—H state participates in the deposition.

Therefore, when the SiC film is deposited as described above, if $SiF_4$ is used as a raw material of Si, H is substantially inhibited from being incorporated into the formed SiC film, even if a hydrocarbon compound is used as a raw material of C. If a raw material containing no H, e.g., $CF_4$, is also used as a raw material of C, from the point of view of the decrease of the amount of H in the formed hard mask, a better state can be obtained.

When an inorganic insulating film containing Si is formed by the CVD method, examples of combinations of source gases and formed inorganic insulating films are shown as follows. In the following, source gases are shown on the left of "→", and deposited inorganic insulating films are shown on the right of "→". On the left of "→", raw materials of Si and other raw materials are shown in that order. Incidentally, TICS is $Si(NCO)_4$ (tetraisocyanatesilane).

(A) $SiF_4+C_2H_4 \rightarrow SiC$
(B) $SiF_4+CF_4 \rightarrow SiC$
(C) $SiF_4+N_2 \rightarrow SiN$
(D) $SiF_4+NF_3 \rightarrow SiN$
(E) $SiF_4+C_2H_4+N_2 \rightarrow SiCN$
(F) $SiF_4+CF_4+N_2 \rightarrow SiCN$
(G) $SiF_4+C_2H_4+NF_3 \rightarrow SiCN$
(H) $SiF_4+CF_4+NF_3 \rightarrow SiCN$
(I) $Si_2F_6+C_2H_4 \rightarrow SiC$
(J) $Si_2F_6+CF_4 \rightarrow SiC$
(K) $Si_2F_6+N_2 \rightarrow SiN$
(L) $Si_2F_6+NF_3 \rightarrow SIN$
(M) $Si_2F_6+C_2H_4+N_2 \rightarrow SiCN$
(N) $Si_2F_6+CF_4+N_2 \rightarrow SiCN$
(O) $Si_2F_6+C_2H_4+NF_3 \rightarrow SiCN$
(P) $Si_2F_6+CF_4+NF_3 \rightarrow SiCN$
(Q) $TICS+C_2H_4 \rightarrow SiC$ (R) $TICS+C_2H_4+N_2 \rightarrow SiCN$
(S) $TICS+N_2$ (or $NH_3$)$\rightarrow SiN$
(T) $TICS+C_2H_4+BF_3$ (or $B_2F_6$)$\rightarrow SiBC$
(U) $TICS+BF_3$ (or $B_2F_6$)$+N_2$ (or $NH_3$)$\rightarrow SiBN$
(V) $TICS+BF_3$ (or $B_2F_6$)$+C_2H_4+N_2$ (or $NH_3$)$\rightarrow SiBCN$
(W) $TICS+SiF_4+O_2 \rightarrow SiOF$
(X) $TICS+O_2 \rightarrow SiO_2$ Then, in cases where $SiF_4$ or $Si_2F_6$ was used as a raw material of Si as shown in (A) through (P) and where $SiH_4$ was used as conventional methods, the amounts of H degassed from the formed inorganic insulating film were comparatively measured. The measurement of degassing was as follows. First, a substrate, on which an inorganic insulating film had been formed, was cut into pieces 1 cm square which were heated at a temperature rising rate of 12° C./min while being mounted in a vacuum vessel. Then, after the temperature of the substrate reached 400° C., the temperature was held for 30 minutes, and the mass spectrum of gas generated from the inorganic insulating film was observed to measure the concentration of H degassed from the inorganic insulating film (temperature-rising leaving gas analysis).

As a result, as shown in the following, it was found that the amount of H degassed in the case of the use of $SiF_4$ or $Si_2F_6$ as a raw material of Si is far smaller than that in the case of the use of $SiH_4$ as a raw material of Si. In the following, (A) through (P) on the left correspond to (A) through (P) in combinations of the above described source gases with the formed inorganic insulating films, respectively. Degassing intensities (mass spectra) using $SiF_4$ or $Si_2F_6$ are shown on the right of "$\rightarrow$", and degassing intensities using $SiH_4$ are shown on the left of "$\rightarrow$". For example, with respect to the degassing intensities of H shown in the following (A), the result, which was obtained when SiC was deposited by $SiH_4+C_2H_4$, is shown on the left of "$\rightarrow$", and the result, which was obtained when SiC was deposited by $SiF_4+C_2H_4$, is shown on the right of "$\rightarrow$"

(A) 16280→2130
(B) 12547→1145
(C) 11457→1245
(D) 11457→1038
(E) 17519→2431
(F) 10985→1368
(G) 18273→2538
(H) 13658→1147
(I) 17420→2359
(J) 10235→1258
(K) 12369→1147
(L) 11903→1047
(M) 19561→2631
(N) 13697→1039
(O) 20231→2852
(P) 11903→1239

Figure 2:
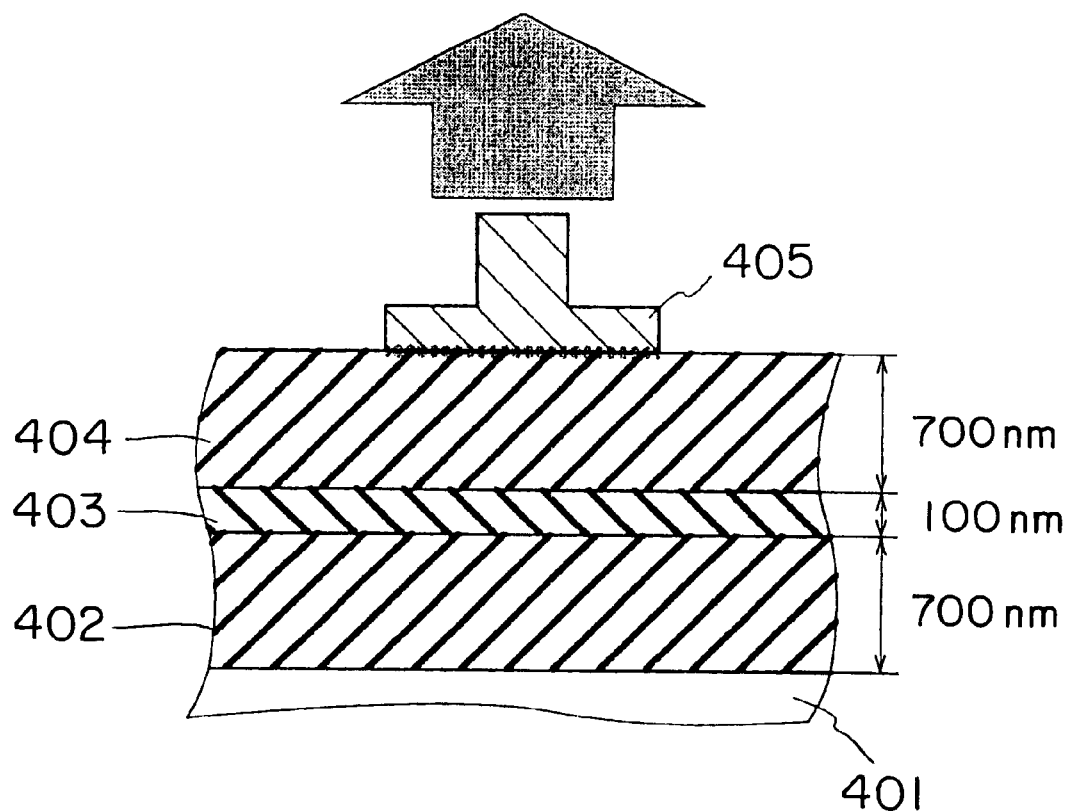
FIG. 2 is a schematic longitudinal section for explaining a method for measuring an adhesion strength.
Figure 3:
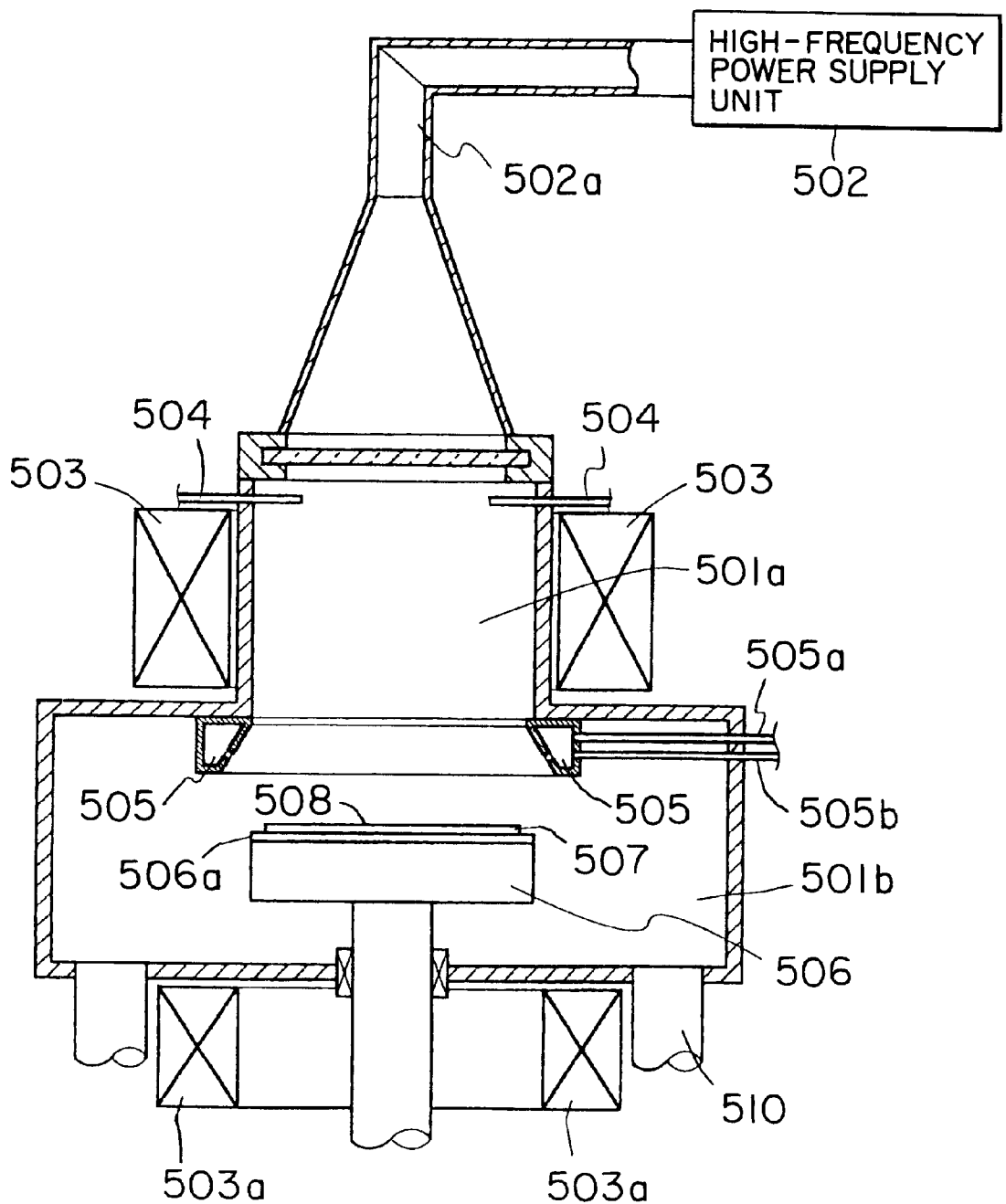
FIG. 3 is a schematic longitudinal section showing the construction of a plasma deposition system for forming a fluorine-containing carbon film.

Then, in cases where $SiF_4$, $Si_2F_6$ or TICS was used as a raw material of Si as described above and where $SiH_4$ was used as a raw material of Si as conventional methods, the adhesions of the formed inorganic insulating film to the fluorine-containing carbon film stacked thereon were compared with each other. In this case, the adhesion strengths in the three-layer structure of "fluorine-containing carbon film/ inorganic insulating film/fluorine-containing carbon film" were compared with each other. The adhesion strengths were measured as follows. First, as shown in FIG. 2, a fluorine-containing carbon film 402, an inorganic insulating film 403 and a fluorine-containing carbon film 404 were sequentially stacked on a substrate 401 to prepare a sample, and a test rod 405 was fixed on the fluorine-containing carbon film 404 by a predetermined adhesive. Then, a load was applied to the test rod 405 in the opposite direction to the substrate 401 while fixing the substrate 401. It was assumed that a load (Kpsi) was the adhesive strength when any one of the films was peeled off.

As a result, as shown in the following, it was found that the adhesive strength in the case of the use of $SiF_4$, $Si_2F_6$ or TICS was greater than that in the case of the use of $SiH_4$. In the following, (A) through (W) on the left correspond to (A) through (W) of combinations of the above described source gases with the formed inorganic insulating films, respectively. The adhesion strength (Kpsi) in the case of the use of $SiF_4$, $Si_2F_6$ or TICS is shown on the right of "$\rightarrow$", and the adhesion strength (Kpsi) in the case of the use of $SiH_4$ in place thereof is shown on the left of "$\rightarrow$". For example, with respect to the adhesion strength shown in the following (A), the result, which was obtained when SiC was deposited by $SiH_4+C_2H_4$, is shown on the left of "$\rightarrow$", and the result, which was obtained when SiC was deposited by $SiF_4+C_2H_4$, is shown on the right of "$\rightarrow$".

(A) 4.0→9.3
(B) 4.4→9.6
(C) 1.9→6.2
(D) 1.8→6.1
(E) 3.0→8.0
(F) 3.8→9.2
(G) 2.9→7.9
(H) 3.7→9.1
(I) 3.9→9.3
(J) 4.3→9.4
(K) 1.6→4.9
(L) 1.5→4.6
(M) 2.8→7.8
(N) 3.6→8.7
(O) 2.7→7.7
(P) 3.5→8.6
(Q) 4.0→6.3
(R) 4.2→6.0
(S) 3.9→5.8
(T) 4.0→6.1
(U) 3.8→5.9
(V) 4.3→6.4
(W) 3.5→6.2

In a case where an FSG (SiOF) film was used as the fluorine-containing insulating film (the first insulating layer) in place of the above described fluorine-containing carbon film, adhesions were compared with each other in the same manner. As a result, also in this case, as shown in the following, it was found that the adhesion strength in the case of the use of $SiF_4$, $Si_2F_6$ or TICS was greater than that in the case of the use of $SiH_4$.

(A) 0.9→6.8
(B) 1.1→7.2
(C) 1.3→7.3
(D) 0.6→7.8
(E) 1.7→8.4
(F) 1.3→7.0
(G) 0.9→6.8
(H) 1.0→7.7
(I) 1.0→8.2
(J) 1.2→6.6
(K) 1.4→6.9
(L) 0.9→7.2
(M) 0.6→7.8
(N) 0.9→6.9
(O) 1.1→8.1
(P) 0.9→7.9

(Q) 1.5→7.7
(R) 1.1→7.9
(S) 1.3→8.1
(T) 1.2→6.9
(U) 1.2→7.0
(V) 0.9→7.1
(W) 1.0→7.4

Also in a case where an "F doped SiCO(H) film, where (H) is H in $C_xH_y$ group" was used as the fluorine-containing insulating film (the first insulating layer) in place of the above described fluorine-containing carbon film, adhesions were compared with each other in the same manner. This SiCO(H) film is formed by the plasma CVD method using, e.g., a methylsilane expressed by $SiH_x(CH_3)_y$ or an alkoxysilane, as a raw material, alone or with an oxygen containing gas ($O_2$, $N_2O$, etc.). The "F doped SiCO(H) film" means an SiCO(H) film formed by the plasma CVD method by adding an F containing raw material gas (e.g., $SiF_4$, $C_xF_y$, such as $C_2F_4$ or $C_2F_6$, or $NF_3$) when the SiCO(H) film is formed. As a result, also in this case, as shown in the following, it was found that the adhesion strength in the case of the use of $SiF_4$, $Fi_2F_6$ or TICS was greater than that in the case of the use of $SiH_4$.

(A) 2.6→8.0
(B) 3.1→7.9
(C) 3.2→8.8
(D) 2.8→7.6
(E) 2.1→8.0
(F) 3.3→6.9
(G) 2.9→7.7
(H) 2.2→7.1
(I) 2.0→8.9
(J) 1.9→8.8
(K) 2.1→6.9
(L) 2.2→7.2
(M) 2.3→8.1
(N) 2.5→7.7
(O) 2.9→7.9
(P) 2.2→8.7
(Q) 3.1→6.9
(R) 2.9→7.7
(S) 2.4→7.6
(T) 3.2→9.0
(U) 3.1→8.7
(V) 3.0→7.7
(W) 2.5→7.0

As described above, in this preferred embodiment, when the inorganic insulating film serving as the hard mask was deposited by the CVD method, a gas containing no H was used as the raw material gas of Si, and more preferably, gases containing no H were used as all the raw material gases. As a result, it is possible to inhibit H from being incorporated into the deposited inorganic insulating film, so that it is possible to inhibit the deterioration of the adhesion of the hard mask to adjacent films, such as fluorine-containing carbon films.

While the inorganic insulating film has been deposited by the CVD method in the state that the raw material gas has not contained H in the above described preferred embodiment, it is possible to inhibit H from being incorporated into the deposited inorganic insulating film even if the inorganic insulating film is deposited by the sputtering method in the same state.

That is, if the inorganic insulating film is deposited by the sputtering method, by which plasma is produced with a gas containing no H, it is possible to inhibit H from being incorporated into the deposited inorganic insulating film. For example, if SiC, SiN or SiCN is deposited as the inorganic insulating film by this sputtering method, gases and targets may be selected as shown in the following table.

| Inorganic Insulating Film | Target | Gas |
| --- | --- | --- |
| SiC Film | SiC | Ar |
| SiN Film | Si | Ar + $N_2$ (or $NH_3$) |
| SiCN Film | SiC | Ar + $N_2$ (or $NH_3$) |

After the degassing intensities at 400° C. were measured as described above when the deposition was carried out by the sputtering method, the degassing intensities in the cases of SiC and SiCN were about 2100 and about 2900, respectively, which were low values.

The adhesion strengths of SiC and SiCN to the fluorine-containing carbon film were measured as described above when the deposition was carried out by the sputtering method. As a result, the adhesion strengths in the cases of SiC and SiCN were 7.17 Kpsi and 12.2 Kpsi, respectively. In either case, it was revealed that the decrease of the adhesion strength was inhibited, as compared with the case where the inorganic insulating film was formed by the CVD method using $SiH_4$ as the raw material of Si.

While the groove portion has been formed in the F containing interlayer film, such as the fluorine-containing carbon film, to be filled with the wiring layer in the above described preferred embodiment, the present invention should not be limited thereto. That is, a wiring layer may be formed beforehand, and an interlayer film may be formed so as to cover the wiring layer.

While the wiring layer has been made of Al in the above described preferred embodiment, the present invention should not be limited thereto, but another conductive material, such as Cu, may be used.

What is claimed is:

1. A method of manufacturing a semiconductor device comprising the steps of:

forming a wiring layer on a semiconductor substrate, on which an element has been formed;

forming a first insulating layer containing fluorine on the wiring layer;

forming a second insulating layer containing silicon on the first insulating layer;

selectively etching the second insulating layer until a part of a surface of the first insulating layer is exposed;

selectively etching the first insulating layer using the selectively etched second insulating layer as a mask; and forming a new wiring layer on the second insulating layer after selectively etching the first insulating layer, said second insulating layer being formed from a silicon compound as a raw material, said silicon compound being hydrogen free.

2. A method of manufacturing a semiconductor device as set forth in claim 1, wherein a second raw material used in forming said second insulating layer is also hydrogen free.

3. A method of manufacturing a semiconductor device as set forth in claim 2, wherein the step of forming the second insulating layer is carried out by a chemical vapor deposition process.

4. A method of manufacturing a semiconductor device as set forth in claim 2, wherein the step of forming the second insulating layer is carried out by a sputtering process.

5. A method of manufacturing a semiconductor device as set forth in claim 4, wherein the step of forming the second insulating layer is carried out by the sputtering process using a plasma of a gas containing no hydrogen.

6. A method of manufacturing a semiconductor device as set forth in claim 2, wherein said second raw material comprises a compound containing carbon.

7. A method of manufacturing a semiconductor device as set forth in claim 1, wherein the step of forming the second insulating layer is carried out by a chemical vapor deposition process.

8. A method of manufacturing a semiconductor device as set forth in claim 1, wherein the step of forming the second insulating layer is carried out by a sputtering process.

9. A method of manufacturing a semiconductor device as set forth in claim 8, wherein the step of forming the second insulating layer is carried out by the sputtering process using a plasma of a gas containing no hydrogen.

* * * * *